United States Patent
Choi et al.

(10) Patent No.: US 10,593,732 B2
(45) Date of Patent: Mar. 17, 2020

(54) LIGHT EMITTING DIODE

(71) Applicant: Samsung Display Co., Ltd., Yongin-si, Gyeonggi-do (KR)

(72) Inventors: Chul Hyun Choi, Yongin-si (KR); Hyun Shik Lee, Incheon (KR); Hyuk Sang Jun, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/939,208

(22) Filed: Mar. 28, 2018

(65) Prior Publication Data

US 2019/0043929 A1   Feb. 7, 2019

(30) Foreign Application Priority Data

Aug. 7, 2017   (KR) .......... 10-2017-0099542

(51) Int. Cl.
| | |
|---|---|
| *H01L 27/32* | (2006.01) |
| *H01L 51/52* | (2006.01) |
| *H01L 33/52* | (2010.01) |
| *H01L 33/40* | (2010.01) |
| *H01L 51/00* | (2006.01) |

(52) U.S. Cl.
CPC .......... *H01L 27/3206* (2013.01); *H01L 33/40* (2013.01); *H01L 33/52* (2013.01); *H01L 51/5203* (2013.01); *H01L 51/5237* (2013.01); *H01L 51/5253* (2013.01); *H01L 51/5275* (2013.01); *H01L 27/3244* (2013.01); *H01L 51/0081* (2013.01); *H01L 2251/558* (2013.01)

(58) Field of Classification Search
CPC ..... H01L 27/3206; H01L 33/40; H01L 33/52; H01L 51/5203; H01L 51/5237; H01L 51/5275; H01L 2251/558
See application file for complete search history.

(56) References Cited

U.S. PATENT DOCUMENTS

2010/0210772 A1*  8/2010  Hiwatashi .............. C09J 133/08
                                                         524/407
2014/0070195 A1*  3/2014  Choi .................... H01L 51/5237
                                                          257/40
(Continued)

FOREIGN PATENT DOCUMENTS

JP       2014-517488 A     7/2014
KR   10-2014-0034600 A     3/2014
(Continued)

OTHER PUBLICATIONS

Edminister et. al "Schaum's Outline of Electromagnetics, 4th Edition", 2014, ISBN: 9780071831475, McGraw-Hill Education (Year: 2014).*

(Continued)

*Primary Examiner* — Sitaramarao S Yechuri
(74) *Attorney, Agent, or Firm* — Innovation Counsel LLP

(57) ABSTRACT

A light-emitting diode according to an exemplary embodiment includes: a first electrode; a second electrode overlapping the first electrode; an emission layer positioned between the first electrode and the second electrode; and a first capping layer positioned on the first electrode, wherein the first capping layer includes at least one among LiF, $MgF_2$, $AlF_3$, NaF, and $AlO_x$, and a thickness of the first capping layer is 30 nm to 40 nm.

18 Claims, 7 Drawing Sheets

(56) References Cited

U.S. PATENT DOCUMENTS

| | | | |
|---|---|---|---|
| 2014/0138636 A1* | 5/2014 | Song | H01L 51/5262 257/40 |
| 2014/0191212 A1 | 7/2014 | Lienhart | |
| 2014/0374705 A1* | 12/2014 | Song | H01L 51/5275 257/40 |
| 2015/0183301 A1* | 7/2015 | Diguet | C03C 17/36 428/623 |

FOREIGN PATENT DOCUMENTS

| | | |
|---|---|---|
| KR | 10-2014-0048202 A | 4/2014 |
| KR | 10-2015-0047794 A | 5/2015 |
| KR | 10-2015-0076740 A | 7/2015 |
| KR | 10-1608332 B1 | 3/2016 |
| KR | 10-2016-0060214 A | 5/2016 |
| WO | WO2012-172258 A1 | 12/2012 |

OTHER PUBLICATIONS

Schulz et. al, "Optical constants of silver, gold, copper, and aluminum", Journal of the optical society of america, vol. 44, Issue 5, pp. 362-368 (Year: 1954).*

* cited by examiner

LIGHT EMITTING DIODE

CROSS-REFERENCE TO RELATED APPLICATION

This application claims priority to and the benefit of Korean Patent Application No. 10-2017-0099542 filed in the Korean Intellectual Property Office on Aug. 7, 2017, the disclosure of which is incorporated herein by reference in its entirety.

BACKGROUND

(a) Technical Field

The present disclosure relates to a light-emitting diode, and in particular, relates to a light-emitting diode including a capping layer of an optimized thickness.

(b) Description of the Related Art

A light-emitting diode (LED) is a self-emissive element that has advantages of a wide viewing angle, a superior contrast ratio, a fast response speed, excellent luminance, a driving voltage, and response speed characteristics, and a multi-coloring characteristic.

The light-emitting diode may have a structure in which a first electrode is disposed on a substrate, and a hole transport region, an emission layer, an electron transport region, and a second electrode are sequentially formed on the first electrode. Holes injected from the first electrode move to the emission layer via the hole transport region, and electrons injected from the second electrode move to the emission layer via the electron transport region.

Carriers such as the holes and the electrons are recombined in the emission layer region, thereby generating excitons. Light is generated while the excitons is changed from an excited state to a ground state.

A plurality of light-emitting diodes included in a display device may have different stacked structures from each other by considering a wavelength of the emitted light or a material of the emission layer. In detail, the plurality of light-emitting diodes may have a thickness and a structure considering a micro-cavity distance between two electrodes depending on a wavelength of the light emitted from each emission layer pattern.

However, as intensity of the light emitted from each light-emitting diode by the micro-cavity effect increases, viewing angle characteristics may deteriorate. In detail, if the intensity of the light emitted from each light-emitting diode by the micro-cavity effect increases, a color shift depending on a viewing angle of the organic light emitting diode display increases, thereby causing a change of the color shown to the user depending on the viewing angle. Particularly, in a case of realizing a white of the emissive diode display by mixing light of different colors emitted from the plurality of light-emitting diodes, since a color deviation of the white light depending on the viewing angle further increases by each color shift of the light emitted from the plurality of light-emitting diodes, display quality of the emissive diode display may also be largely deteriorated.

The above information disclosed in this Background section is only for enhancement of understanding of the background of the present disclosure, and therefore it may contain information that does not form a prior art that is already known to a person of ordinary skill in the art.

SUMMARY

Exemplary embodiments of the present disclosure provide a light-emitting diode with improved color distribution.

A light-emitting diode according to an exemplary embodiment of the present disclosure includes: a first electrode; a second electrode overlapping the first electrode; an emission layer positioned between the first electrode and the second electrode; and a first capping layer positioned on the first electrode, wherein the first capping layer includes at least one among LiF, $MgF_2$, $AlF_3$, NaF, and $AlO_x$, and a thickness of the first capping layer is 30 nm to 40 nm.

A second capping layer positioned between the first electrode and the first capping layer may be further included.

The thickness of the second capping layer may be less than 65 nm.

The second capping layer may be at least one among $SiO_2$, $SiN_x$, ZnS, PA, PI, $TeO_2$, $WO_3$, $V_2O_5$, $Al_xO_y$, ZnSe, a triamine derivative, an arylene diamine derivative, CBP, and tris(8-hydroxy-quinolinato)aluminum (Alq3).

Reflectance for a 550 nm wavelength may be less than 0.1 at an interface between the first electrode and the first capping layer.

A refractive index of the first capping layer may be 1.1 to 1.4.

A light-emitting diode according to another exemplary embodiment of the present disclosure includes: a first electrode; a second electrode overlapping the first electrode; an emission layer positioned between the first electrode and the second electrode; a first capping layer positioned on the first electrode; and a second capping layer positioned between the first capping layer and the first electrode, wherein the first capping layer includes at least one among LiF, $MgF_2$, $AlF_3$, NaF, and $AlO_x$, and a thickness of the second capping layer is less than 65 nm.

The second capping layer may be at least one among $SiO_2$, $SiN_x$, ZnS, PA, PI, $TeO_2$, $WO_3$, $V_2O_5$, $Al_xO_y$, ZnSe, a triamine derivative, an arylene diamine derivative, CBP, and tris(8-hydroxy-quinolinato)aluminum (Alq3).

The first capping layer may include LiF alone, and the thickness of the first capping layer may be 30 nm to 40 nm.

Reflectance for a 550 nm wavelength may be less than 0.1 at an interface between the first electrode and the second capping layer.

The second capping layer may be in direct contact with the first electrode.

A light-emitting diode according to another exemplary embodiment of the present disclosure includes: a first electrode; a second electrode overlapping the first electrode; an emission layer positioned between the first electrode and the second electrode; and a first capping layer positioned on the first electrode, wherein a refractive index of the first capping layer is 1.1 to 1.4, and a thickness of the first capping layer is 30 nm to 40 nm.

A second capping layer positioned between the first electrode and the first capping layer may be further included.

A thickness of the second capping layer may be less than 65 nm.

The first capping layer may include at least one among LiF, $MgF_2$, $AlF_3$, NaF, and $AlO_x$.

According to the exemplary embodiments, the light-emitting diode with improved color distribution is provided.

DETAILED DESCRIPTION OF THE EMBODIMENTS

Figure 1:
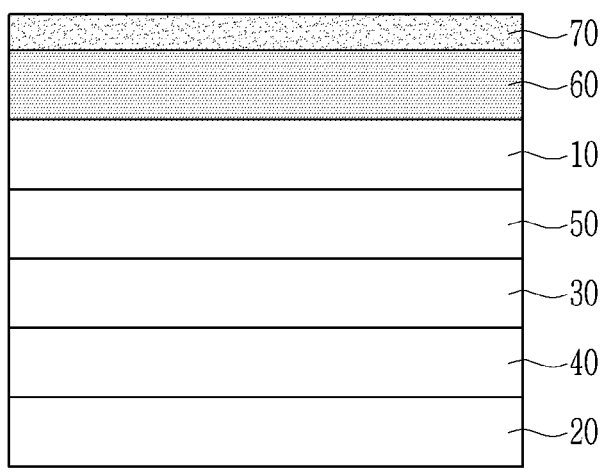
FIG. 1 is a cross-sectional view of a light-emitting diode according to an exemplary embodiment.

The present disclosure will be described more fully hereinafter with reference to the accompanying drawings, in which exemplary embodiments of the present disclosure are shown. As those skilled in the art would realize, the described embodiments may be modified in various different ways, without departing from the spirit or scope of the present disclosure.

In order to clearly explain the present disclosure, a portion that is not directly related to the present disclosure may be omitted, and the same reference numerals are attached to the same or similar constituent elements through the entire specification.

In addition, the size and thickness of each configuration shown in the drawings are arbitrarily shown for better understanding and ease of description, but the present disclosure is not limited thereto. In the drawings, thickness of layers, films, panels, regions, etc., may be exaggerated for clarity. In the drawings, for better understanding and ease of description, thicknesses of some layers and areas may be exaggerated.

It will be understood that when an element such as a layer, film, region, or substrate is referred to as being "on" another element, it can be directly on the other element or one or more intervening elements may also be present. In contrast, when an element is referred to as being "directly on" another element, there may be no intervening elements present. Further, in the specification, the word "on" or "above" means positioned on or below an object portion, and does not necessarily mean positioned on an upper side of the object portion based on a gravitational direction.

In addition, unless explicitly described to the contrary, the word "comprise" and variations such as "comprises" or "comprising" will be understood to imply inclusion of stated elements but not exclusion of any other elements.

Further, throughout the specification, the phrase "on a plane" means viewing a target portion from the top, and the phrase "on a cross-section" means viewing a cross-section formed by vertically cutting a target portion from a side.

Now, a light-emitting diode according to an exemplary embodiment of the present disclosure will be described with reference to accompanying drawings. FIG. 1 is a cross-sectional view of a light-emitting diode according to an exemplary embodiment. Referring to FIG. 1, the light-emitting diode according to an exemplary embodiment includes a first electrode 10, a second electrode 20 overlapping the first electrode 10, and an emission layer 30 positioned between the first electrode 10 and the second electrode 20. In addition, a hole transport layer 40 may be positioned between the second electrode 20 and the emission layer 30, and an electron transport layer 50 may be positioned between the first electrode 10 and the emission layer 30.

A first capping layer 70 is positioned on an upper surface of the first electrode 10. Further, a second capping layer 60 is positioned between the first capping layer 70 and the first electrode 10. In the present exemplary embodiment, the light-emitting diode is described by including the first capping layer 70 and the second capping layer 60 on the surface of the first electrode 10. In the present exemplary embodiment, the second capping layer 60 is in direct contact with the first electrode 10, and is a constituent element that is distinguished from an encapsulation layer positioned on the first capping layer 70.

The first capping layer 70 may include at least one among LiF, $MgF_2$, $AlF_3$, NaF, and $AlO_x$, wherein x may be 1 to 5. The refractive index of the first capping layer 70 may be 1.1 to 1.4. For example, the first capping layer 70 may be an LiF layer. In this case, the first capping layer 70 may include only LiF.

In the present exemplary embodiment, the thickness of the first capping layer 70 may be about 30 nm to about 40 nm. In addition, the thickness of the second capping layer 60 may be less than about 65 nm. These ranges provide optimized thicknesses of the first capping layer 70 and the second capping layer 60 to improve a color distribution, for example, the White Angular Dependency (WAD) distribution, of the light-emitting diode. That is, the light-emitting diode having the first capping layer 70 and the second capping layer 60 of the above-thickness range decreases green reflectance and red reflectance, thereby inducing the WAD distribution to be in a preferable direction.

Herein, the WAD distribution represents a displayed color coordinate on a 1976 color coordinate system when the light-emitting diode displays white. Repeated experiments are performed by diversifying an angle of viewing the light-emitting diode, and the color displayed for each experiment is displayed on the 1976 color coordinate system. A distribution of colors in which points are collected on the color coordinate system is referred to as the WAD distribution.

A color characteristic of the light-emitting diode is changed depending on a shape in which the WAD distribution appears on the color coordinate system. For example, if the WAD distribution is distributed in a green or red region, red may appears even when the display device displays white. Particularly, when the WAD distribution is positioned in the red region, this is well recognized to a user.

However, when the WAD distribution is positioned in a blue region, this is not well recognized by the user. Accordingly, to increase the display quality of the light-emitting diode, it is preferable to position the WAD distribution in the blue region.

On the color coordinate system representing the WAD distribution, when the points representing the WAD distribution are distributed in the direction from a left upper end to a right lower end, the WAD distribution is distributed in the green and red regions. When the points representing the WAD distribution on the color coordinate system are distributed in the direction from the left lower end to the right upper, the WAD distribution is distributed in the blue region.

The light-emitting diode according to an exemplary embodiment of the present disclosure reduces the reflectance for green and red and distributes the WAD distribution in the blue region by appropriately controlling the thickness of the first capping layer 70 and the second capping layer 60.

Figure 2:
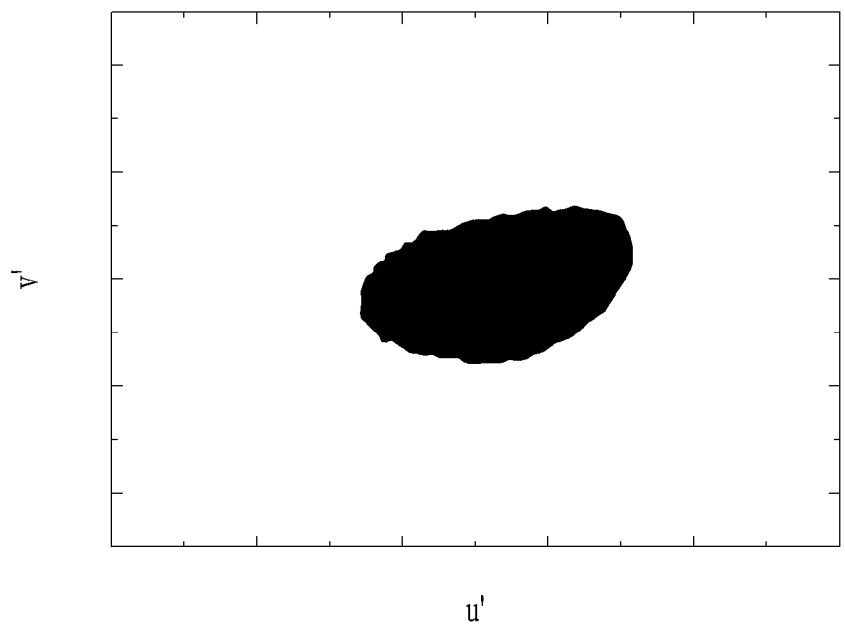
FIG. 2 is a view showing a WAD distribution of a light-emitting diode according to an exemplary embodiment of the present disclosure.
Figure 3:
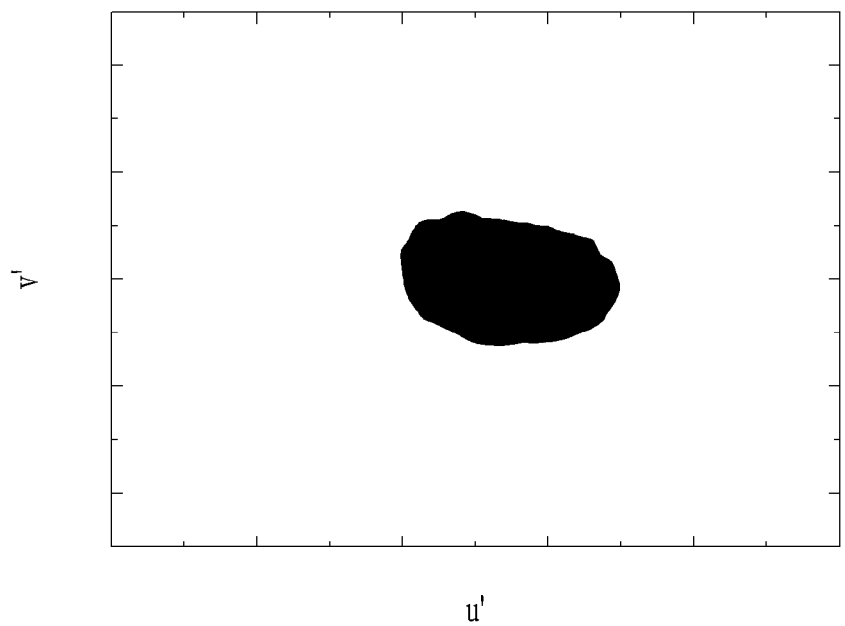
FIG. 3 is a view showing a WAD distribution of a light-emitting diode according to a comparative example of the present disclosure.

FIG. 2 is a view showing a WAD distribution of a light-emitting diode according to an exemplary embodiment of the present disclosure. In FIG. 2, the thickness of the LiF layer (first capping layer) is 40 nm, and the thickness of the second capping layer is 60 nm. FIG. 3 is a view showing a WAD distribution of a light-emitting diode according to a comparative example of the present disclosure. In the comparative example of FIG. 3, the thickness of the LiF layer (first capping layer) is 20 nm, and the thickness of the second capping layer is 82 nm.

When comparing FIG. 2 and FIG. 3, the points representing the WAD distribution are distributed in a direction parallel to a horizontal axis and a direction from the left bottom toward the right top in the case of FIG. 2, however the points representing the WAD distribution are distributed in a direction from the left top toward the right bottom in the case of FIG. 3.

That is, in the case of FIG. 3, the points representing the WAD distribution are distributed in the green and red regions on the color coordinate system. This indicates that a user may recognize an image of a white color to include a red color when the light-emitting diode is applied to the display device.

However, in the case of FIG. 2, the points representing the WAD distribution are distributed in the blue region on the color coordinate system. In this case, when the points representing the WAD distribution are distributed in the blue region, compared with the case of FIG. 3 that the points are distributed in the red region or the green region, since the points are not well recognized, the display quality of the light-emitting diode may be improved. That is, the image closer to the white may be provided to the user.

This is because the reflectance of green and red decreases by controlling the thickness of the first capping layer 70 and the second capping layer 60 in the light-emitting diode according to an exemplary embodiment of the present disclosure, thereby adjusting the WAD distribution. In the light-emitting diode, the thicknesses of the first capping layer 70 and the second capping layer 60 positioned on the light-emitting diode affect the reflectance of the light-emitting diode, and the present disclosure derives the optimized thicknesses capable of reducing the green reflectance.

Figure 4:
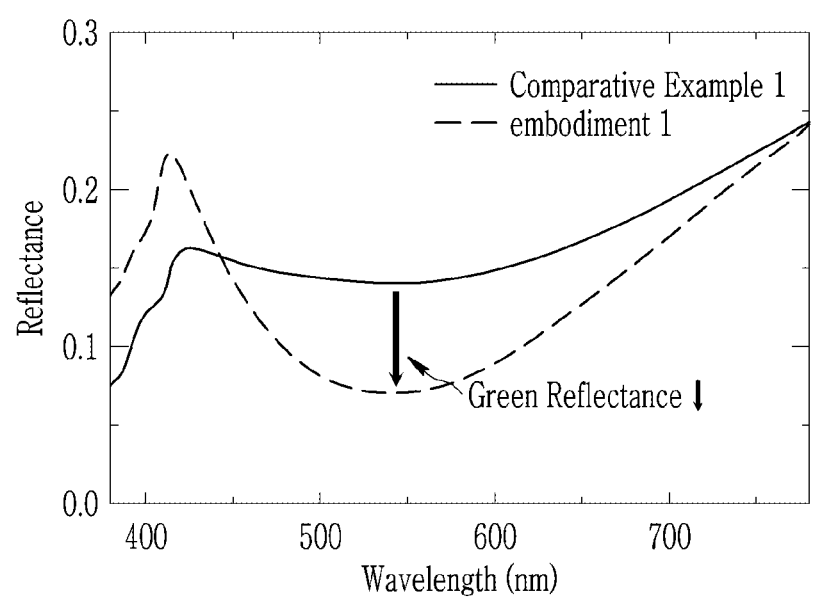
FIG. 4 is a graph showing reflectance depending on a wavelength for Exemplary Embodiment 1 and Comparative Example 1 compared with Exemplary Embodiment 1 in a light-emitting diode according to an exemplary embodiment of the present disclosure.

FIG. 4 shows the reflectance on the interface of the first electrode 10 for Exemplary Embodiment 1 in which the thickness of the LiF layer is 40 nm and the thickness of the second capping layer 60 is 60 nm, and Comparative Example 1 in which that the thickness of the LiF layer is 20 nm and the thickness of the second capping layer is 82 nm.

Figure 5:
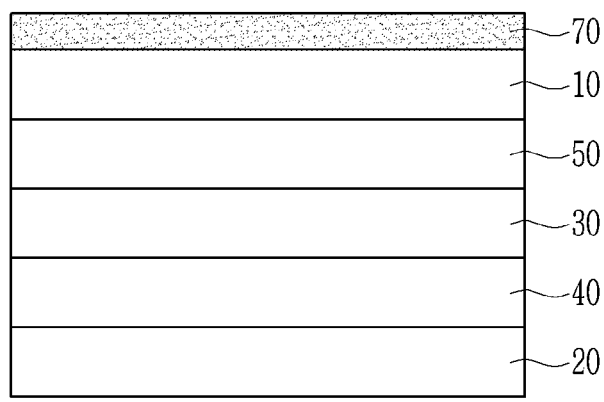
FIG. 5 is a cross-sectional view of a light-emitting diode according to another exemplary embodiment of the present disclosure.
Figure 6:
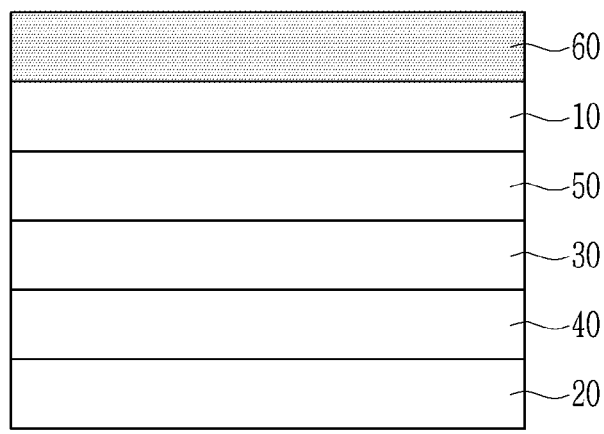
FIG. 6 is a cross-sectional view of a light-emitting diode according to another exemplary embodiment.

Referring to FIG. 4, Exemplary Embodiment 1 shows in comparison with Comparative Example 1 that the reflectance is reduced in the green region. In detail, for the 550 nm (green) wavelength, the reflectance of Comparative Example 1 is about 0.15, whereas the reflectance of Exemplary Embodiment 1 is decreased at less than 0.1 at an interface between the first electrode 10 and the second capping layer 60. It is noted that the same level of decrease in the reflectance for the green wavelength is obtained in a case only one capping layer is included in the light-emitting diode as shown in FIGS. 5 and 6.

That is, in the light-emitting diode according to the present exemplary embodiment, the reflectance is controlled in the green region through the thickness control of the first capping layer 70 and the second capping layer 60, and the WAD distribution is positioned in the blue region.

In the present exemplary embodiment, the second capping layer 60 may be at least one among $SiO_2$, SiNx, ZnS, PA, PI, $TeO_2$, $WO_3$, $V_2O_5$, $AlO_y$, ZnSe, a triamine derivative, an arylene diamine derivative, CBP, and tris(8-hydroxy-quinolinato)aluminum (Alq3), wherein the x may be 1 to 5, however the present disclosure is not limited thereto. The second capping layer 60 may include a material having a higher refractive index than the first capping layer 70.

In the present exemplary embodiment, the first electrode 10 may include an alloy made of two or more materials selected from a group including Ag, Mg, Al, and Yb. For example, the first electrode 10 may include AgMg, in which the content of Ag may be larger than the content of Mg in the first electrode 10. For example, the content of Mg may be about 10 volume % of AgMg. In another example, the first electrode 10 may include AgYb, and the content of Yb may be about 10 volume % of AgYb. However, these are only exemplary, and the present disclosure is not limited thereto. The first electrode 10 may be a transflective electrode acting as a cathode.

The second electrode 20 may include a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or combinations thereof, calcium (Ca), ytterbium (Yb), aluminum (Al), silver (Ag), magnesium (Mg), samarium (Sm), titanium (Ti), gold (Au), or alloys thereof, graphene, carbon nanotubes, or a conductive polymer such as PEDOT:PSS. However, the present disclosure is not limited thereto, and the second electrode 20 may be formed of the stacked structure of two or more layers. For example, the second electrode 20 may be a reflecting electrode acting as an anode and having a structure of ITO/Ag/ITO.

The light generated from the emission layer 30 is reflected from the second electrode 20 as the reflecting electrode, and is resonated and amplified between the first electrode 10 as the transflective electrode and the second electrode 20. The resonated light is reflected from the second electrode 20 and is emitted onto the upper surface of the first electrode 10.

The emission layer 30 may include a host and a light emitting dopant. In this case, the content of the dopant is varied depending on a composition of the emission layer 30, for example 3 to 10 weight % with reference to a total weight (100 weight %) of the host and the dopant combined.

A material of the host included in the emission layer 30 may include tris(8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bisbis(2,2-diphenyl-ethene-1-yl)-4,4'-methylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), or the like, and a phosphorescent host may have a material including 1,3-bis(carbazole-9-yl)benzene (mCP), 1,3,5-tris(carbazole-9-yl)benzene (tCP), 4,4',4"-tris(carbazole-9-yl)triphenylamine (TcTa), 4,4'-bis(carbazole-9-yl)biphenyl (CBP), 4,4'-bis(9-carbazolyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), 9,9-bis(9-phenyl-9H-carbazole)fluorene (FL-2CBP), or the like.

The dopant included in the emission layer 30 may include 8-hydroxyquinoline and complexes of similar derivatives, benzazole derivatives, and the like, however the present disclosure is not limited thereto.

In some embodiments, the emission layer 30 may include a quantum dot.

An electron transport layer 50 may be positioned between the emission layer 30 and the first electrode 10. The electron transport layer 50 may include at least one of the electron transport layer and an electron injection layer. In addition, a hole transport layer 40 may be positioned between the emission layer 30 and the second electrode 20. The hole transport layer 40 may include at least one of the hole transport layer and the hole injection layer.

In the above description, a case in which the thicknesses of both the first capping layer 70 and the second capping layer 60 are within an optimized range has been described as an example, however a similar effect may be obtained in another case in which one of the thicknesses of the first capping layer 70 or second capping layer 60 is within an optimized range as another exemplary embodiment of the present disclosure. In addition, a similar effect may also be obtained in a case of a single capping layer structure including either the first capping layer 70 or the second capping layer 60. That is, a case in which the light-emitting diode includes one of the first capping layer 70 or the second capping layer 60 is possible.

FIG. 5 is a cross-sectional view of a light-emitting diode according to another exemplary embodiment of the present disclosure. Referring to FIG. 5, the light-emitting diode according to an exemplary embodiment of FIG. 5 is the same as the exemplary embodiment of FIG. 1 except for the second capping layer 60 that is omitted. The detailed description for the same constituent elements is omitted.

Referring to FIG. 5, in the light-emitting diode according to the present exemplary embodiment, the thickness of the first capping layer 70 is about 30 nm to about 40 nm. Referring to the previous example in which the light-emitting diode includes two capping layers as shown in FIG. 1, the reduction of the green reflectance of the light-emitting diode is obtained due to the thickness increase of the first capping layer 70 and the thickness reduction of the second capping layer 60. While the effect of reducing the green reflectance increases in the light-emitting diode including two capping layers, the reduction of the green reflectance can be obtained in a case in which a single capping layer 70 is within an optimized thickness range. Accordingly, in the exemplary embodiment of FIG. 5, similar to the previous exemplary embodiment, the WAD distribution on the color coordinate may be positioned in the blue region.

FIG. 6 is a cross-sectional view of a light-emitting diode according to another exemplary embodiment. Referring to FIG. 6, the light-emitting diode according to the present exemplary embodiment is the same as the exemplary embodiment of FIG. 1 except for the first capping layer 70 that is omitted. The detailed description for the same constituent elements is omitted.

Referring to FIG. 6, in the light-emitting diode according to the present exemplary embodiment, the thickness of the second capping layer 60 is less than about 65 nm. The reduction of the green reflectance of the light-emitting diode is obtained due to the thickness increase of the first capping layer 70 and the thickness reduction of the second capping layer 60 in the previous example in which the light-emitting diode includes two capping layers as shown in FIG. 1, however the reduction of the green reflectance can be obtained in a case in which a single capping layer 60 is within an optimized thickness range. Accordingly, in the exemplary embodiment of FIG. 6, similar to the previous exemplary embodiment, the WAD distribution on the color coordinate system may be positioned in the blue region.

That is, as above-described, as the light-emitting diode according to an exemplary embodiment of the present disclosure satisfies at least one of the conditions that the thickness of the first capping layer is about 30 nm to about 40 nm or the thickness of the second capping layer is less than about 65 nm, the reflectance of the green wavelength is reduced in the light-emitting diode and the WAD color distribution is positioned toward the blue region. By placing the WAD color distribution toward the blue region, it is possible to mitigate or prevent a phenomenon that an image of a white color looks red to a user, and the display quality of a display device may be improved.

Figure 7:
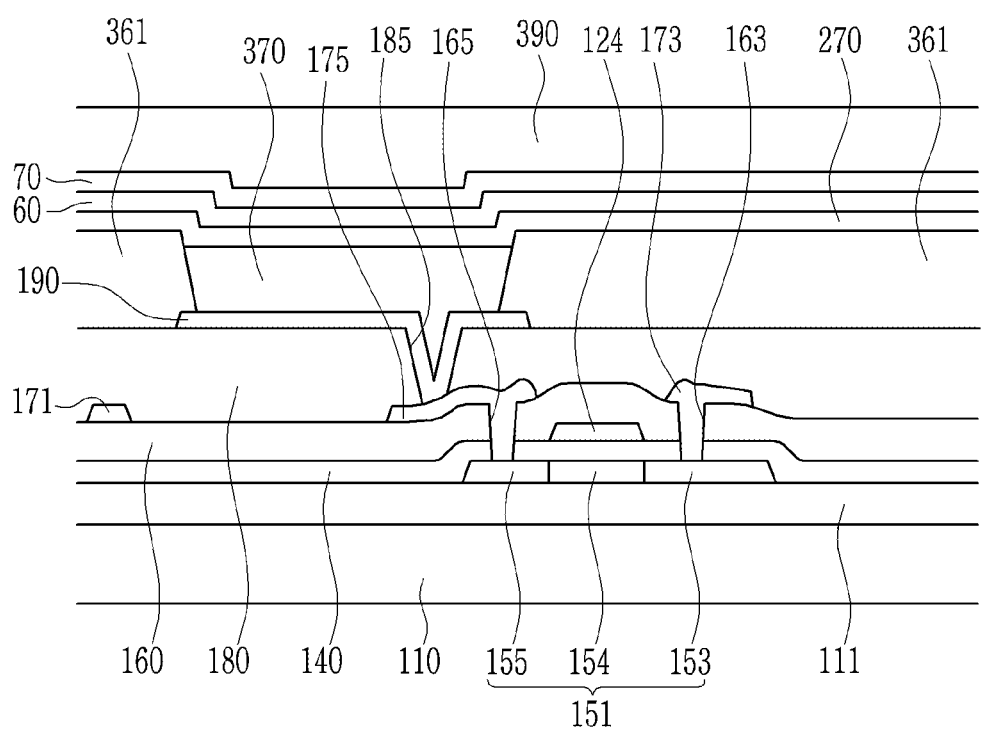
FIG. 7 is a cross-sectional view of a light-emitting diode according to another exemplary embodiment.

Next, the display device according to an exemplary embodiment will be described with reference to FIG. 7. FIG. 7 is a cross-sectional view of a light-emitting diode according to another exemplary embodiment.

Referring to FIG. 7, a buffer layer 111 made of a silicon oxide or a silicon nitride is positioned on a substrate 110.

A semiconductor layer 151 is positioned on the buffer layer 111. The semiconductor layer 151 includes a source region 153 and a drain region 155 that are doped with a p-type impurity, and further includes a channel region 154 positioned between the source region 153 and the drain region 155.

A gate insulating layer 140 is positioned on the semiconductor layer 151 and the buffer layer 111, and may include a silicon oxide or a silicon nitride. A control electrode 124 overlaps the channel region 154 of the semiconductor layer 151 and is positioned on the gate insulating layer 140.

An interlayer insulating layer 160 is positioned on the control electrode 124 and the gate insulating layer 140. The interlayer insulating layer 160 has a first contact hole 165 and a second contact hole 163.

A data conductor including a data line 171, an input electrode 173, and an output electrode 175 is positioned on the interlayer insulating layer 160.

The output electrode 175 is connected to the drain region 155 through the first contact hole 165. In addition, the input electrode 173 is connected to the source region 153 through the second contact hole 163.

A passivation layer 180 is positioned on the data conductor (171, 173, and 175) and the interlayer insulating layer 160, and the passivation layer 180 has a contact hole 185.

A pixel electrode 190 is positioned on the passivation layer 180. The pixel electrode 190 is connected to the output electrode 175 through the contact hole 185. A partition 361 is positioned on the passivation layer 180. A light-emitting diode layer 370 is positioned on the pixel electrode 190, and a common electrode 270 is positioned to overlap the light-emitting diode layer 370. The light-emitting diode includes the pixel electrode 190, the light-emitting diode layer 370, and the common electrode 270.

In this case, the pixel electrode 190 may be an anode of a hole injection electrode and the common electrode 270 may be a cathode of the electron injection electrode. However, the present disclosure is not limited thereto, and the pixel electrode 190 may be the cathode and the common electrode 270 may be the anode depending on the driving method of the display device.

The second capping layer 60 and the first capping layer 70 overlapping the common electrode 270 are formed. The description for the second capping layer 60 and the first capping layer 70 is the same as described above such that the detailed description for the same constituent elements is omitted. That is, the thickness of the first capping layer 70 may be about 30 nm to about 40 nm, and the thickness of the second capping layer 60 may be less than about 65 nm, thereby reducing the reflectance of the green wavelength in the light-emitting diode and positioning the WAD color distribution in the blue region.

An encapsulation layer 390 overlapping the second capping layer 60 and the first capping layer 70 is formed. The encapsulation layer 390 may include an organic material or an inorganic material, or the organic material and the inorganic material may be alternately stacked. The encapsulation layer 390 may protect the display device from external moisture, heat, and other pollutants.

The structure of the above-described display device is an example, and the light-emitting diode according to an embodiment of the present disclosure may be applied to a display device having another structure, which is self-evident.

While the present disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims.

DESCRIPTION OF SYMBOLS

| | |
|---|---|
| 10: first electrode | 20: second electrode |
| 30: emission layer | 40: hole transport layer |
| 50: electron transport layer | 60: second capping layer |
| 70: first capping layer | |

What is claimed is:

1. A light-emitting diode comprising:
a first electrode;
a second electrode overlapping the first electrode;
an emission layer positioned between the first electrode and the second electrode; and
a capping layer positioned on the first electrode,
wherein the capping layer includes a first portion including at least one among LiF, MgF2, AlF3, NaF, and AlOx,
wherein reflectance for a 550 nm green wavelength is reduced to be less than 0.1 at an interface between the first electrode and the capping layer by controlling a thickness of the capping layer between 30 nm and 40 nm thereby distributing a white angular dependency (WAD) distribution in a blue region of a color coordinate system.

2. The light-emitting diode of claim 1, wherein the capping layer further includes a second portion including at least one among SiO2, SiNx, ZnS, PA, PI, TeO2, WO3, V2O5, AlxOy, ZnSe, a triamine derivative, an arylene diamine derivative, CBP, and tris(8-hydroxy-quinolinato) aluminum (Alq3).

3. The light-emitting diode of claim 1, wherein
a refractive index of the first portion of the capping layer is 1.1 to 1.4.

4. The light-emitting diode of claim 1, wherein
the first portion of the capping layer includes LiF alone, and the thickness of the first portion of the capping layer is 30 nm to 40 nm.

5. A light-emitting diode comprising:
a first electrode;
a second electrode overlapping the first electrode;
an emission layer positioned between the first electrode and the second electrode;
a first capping layer positioned on the first electrode; and
a second capping layer positioned between the first capping layer and the first electrode,
wherein the first capping layer includes at least one among LiF, MgF2, AlF3, NaF, and AlOx,
wherein reflectance for a 550 nm green wavelength is reduced to be less than 0.1 at an interface between the first electrode and the second capping layer by controlling a thickness of the second capping layer less than 65 nm thereby distributing a white angular dependency (WAD) distribution in a blue region of a color coordinate system.

6. The light-emitting diode of claim 5, wherein
the second capping layer is in direct contact with the first electrode.

7. A light-emitting diode comprising:
a first electrode;
a second electrode overlapping the first electrode;
an emission layer positioned between the first electrode and the second electrode; and
a capping layer positioned on the first electrode,
wherein a refractive index of the capping layer is 1.1 to 1.4, and
wherein reflectance for a 550 nm green wavelength is reduced to be less than 0.1 at an interface between the first electrode and the capping layer by controlling a thickness of a first portion of the capping layer between 30 nm and 40 nm thereby distributing a white angular dependency (WAD) distribution in a blue region of a color coordinate system.

8. The light-emitting diode of claim 7, wherein the capping layer further includes a second portion positioned between the first electrode and the first portion of the capping layer.

9. The light-emitting diode of claim 8, wherein
a thickness of the second portion of the capping layer is less than 65 nm.

10. The light-emitting diode of claim 7, wherein
the first portion of the capping layer includes at least one among LiF, MgF2, AlF3, NaF, and AlOx.

11. A light-emitting diode comprising:
a first electrode;
a second electrode overlapping the first electrode;
an emission layer positioned between the first electrode and the second electrode;
a first capping layer positioned on the first electrode, and
a second capping layer positioned between the first electrode and the first capping layer,
wherein the first capping layer includes at least one among LiF, MgF$_2$, AlF3, NaF, and AlOx,
wherein the thickness of the second capping layer is greater than the thickness of the first capping layer, and
wherein reflectance for a 550 nm green wavelength is reduced to be less than 0.1 at an interface between the first electrode and the second capping layer by controlling a thickness of the first capping layer between 30 nm and 40 nm and a thickness of the second capping layer less than 65 nm thereby distributing a white angular dependency (WAD) distribution in a blue region of a color coordinate system.

12. The light-emitting diode of claim 11, wherein
the second capping layer is at least one among SiO2, SiNx, ZnS, PA, PI, TeO2, WO3, V2O5, AlxOy, ZnSe, a triamine derivative, an arylene diamine derivative, CBP, and tris(8-hydroxy-quinolinato)aluminum (Alq3).

13. The light-emitting diode of claim 11, wherein a refractive index of the first capping layer is 1.1 to 1.4.

14. The light-emitting diode of claim 11, wherein the second capping layer is in direct contact with the first electrode.

15. A light-emitting diode comprising:
a first electrode;
a second electrode overlapping the first electrode;
an emission layer positioned between the first electrode and the second electrode;
a first capping layer positioned on the first electrode; and
a second capping layer positioned between the first capping layer and the first electrode,
wherein the first capping layer includes at least one among LiF, MgF2, AlF3, NaF, and AlOx,
wherein a thickness of the second capping layer is less than 65 nm,
wherein the second capping layer is at least one among SiO2, SiNx, ZnS, PA, PI, TeO2, WO3, V2O5, AlxOy, ZnSe, a triamine derivative, an arylene diamine derivative, CBP, and tris(8-hydroxy-quinolinato)aluminum (Alq3),
wherein the thickness of the second capping layer is greater than the thickness of the first capping layer, and
wherein reflectance for a 550 nm green wavelength is reduced to be less than 0.1 at an interface between the first electrode and the second capping layer by controlling a thickness of the first capping layer between 30 nm and 40 nm thereby distributing a white angular dependency (WAD) distribution in a blue region of a color coordinate system.

16. The light-emitting diode of claim 15, wherein the first capping layer includes LiF alone, and the thickness of the first capping layer is 30 nm to 40 nm.

17. A light-emitting diode comprising:
a first electrode;
a second electrode overlapping the first electrode;
an emission layer positioned between the first electrode and the second electrode;
a first capping layer positioned on the first electrode; and
a second capping layer positioned between the first electrode and the first capping layer,
wherein a refractive index of the first capping layer is 1.1 to 1.4,
wherein the thickness of the second capping layer is greater than the thickness of the first capping layer, and
wherein reflectance for a 550 nm green wavelength is reduced to be less than 0.1 at an interface between the first electrode and the second capping layer by controlling a thickness of the first capping layer between 30 nm and 40 nm and a thickness of the second capping layer less than 65 nm thereby distributing a white angular dependency (WAD) distribution in a blue region of a color coordinate system.

18. The light-emitting diode of claim 17, wherein the first capping layer includes at least one among LiF, MgF2, AlF3, NaF, and AlOx.

* * * * *